(12) United States Patent
Howell et al.

(10) Patent No.: US 6,734,597 B1
(45) Date of Patent: May 11, 2004

(54) THERMOMECHANICAL IN-PLANE MICROACTUATOR

(75) Inventors: Larry L. Howell, Orem, UT (US); Scott Lyon, Provo, UT (US)

(73) Assignee: Brigham Young University, Provo, UT (US)

(*) Notice: Subject to any disclaimer, the term of this patent is extended or adjusted under 35 U.S.C. 154(b) by 0 days.

(21) Appl. No.: 10/312,172

(22) PCT Filed: Jun. 18, 2001

(86) PCT No.: PCT/US01/19399
§ 371 (c)(1),
(2), (4) Date: Dec. 18, 2002

(87) PCT Pub. No.: WO01/99098
PCT Pub. Date: Dec. 27, 2001

Related U.S. Application Data

(60) Provisional application No. 60/212,249, filed on Jun. 19, 2000.

(51) Int. Cl.[7] .................. H02N 10/00; H01N 41/00; H01N 47/00
(52) U.S. Cl. .................. 310/306; 310/307
(58) Field of Search .................. 310/306, 307, 310/309; 60/527, 528; 361/160–164; 360/294.4, 294.6

(56) References Cited

U.S. PATENT DOCUMENTS

| | | | |
|---|---|---|---|
| 4,806,815 A | * 2/1989 | Honma | 310/307 |
| 5,796,152 A | * 8/1998 | Carr et al. | 257/415 |
| 5,909,078 A | 6/1999 | Wood et al. | |
| 5,994,816 A | 11/1999 | Dhuler et al. | |
| 6,211,598 B1 | 4/2001 | Dhuler et al. | |
| 6,236,139 B1 | 5/2001 | Hill et al. | |
| 6,255,757 B1 | 7/2001 | Dhuler et al. | |
| 6,291,922 B1 | 9/2001 | Dhuler | |
| 6,367,251 B1 | * 4/2002 | Wood | 60/528 |
| 6,386,507 B2 | * 5/2002 | Dhuler et al. | 251/11 |
| 6,590,313 B2 | * 7/2003 | Agrawal et al. | 310/307 |
| 2001/0008357 A1 | 7/2001 | Dhuler et al. | |

OTHER PUBLICATIONS

Que, L. et al., "Bent–Beam Electro–Thermal Actuators for High Force Applications", IEEE, pp. 31–36, 1999.
Comtois, John H. et al., "Surface Micromachined Polysilicon Thermal Actuator Arrays and Applications", Solid State Sensor and Actuator Workshop Hilton Head, South Carolina, pp. 174–177, Jun. 2–6, 1996.
Cragun, Rebecca et al., "Linear Thermomechanical Microactuators," Microelectromechanical Systems (MEMS), at the 1999 ASME International Mechanical Engineering Congress and Exposition, pp. 181–188, Nov., 1999.
Maloney, John M. et al., "Analysis and Design of Electrothermal Actuators Fabricated From Single Crystal Silicon", MEMS–vol. 2, Micro–Electro–Mechanical Systems (MEMS)–2000, ASME Nov. 5–10, 2000.

* cited by examiner

Primary Examiner—Tran Nguyen
(74) Attorney, Agent, or Firm—Madson & Metcalf

(57) ABSTRACT

A microactuator providing an output force and displacement in response to an increase in thermal energy is disposed. The microactuator may have a substantially straight expansion member with a first and a second end. The first end may be coupled to a base member, and the second end may be coupled to a shuttle. The expansion member is capable of elongating in a elongation direction. Elongation of the expansion member may urge the shuttle to translate in an output direction substantially different than the elongation direction. In certain embodiments, multiple expansion members are arrayed along one side of the shuttle to drive the shuttle against a surface. Alternatively, expansion members may be disposed on both sides of the shuttle to provide balanced output force. If desired, multiple microactuators may be linked together to multiply the output displacement and/or output force.

46 Claims, 6 Drawing Sheets

THERMOMECHANICAL IN-PLANE MICROACTUATOR

This application claims the benefit of provisional application Ser. No. 60/212,249 filed Jun. 19, 2000.

FIELD OF THE INVENTION

The present device relates to microelectromechanical systems. More particularly, the device relates to thermally activated microactuators.

TECHNICAL BACKGROUND

Many different transducers have been created to convert electricity and thermal energy into mechanical force or motion. For example, electric linear and rotary motors, relays, and the like are used for many applications. Relays, in particular, are used to carry out functions such as valving and switching when actuated by a current.

However, previously known transducers are typically ill-suited for use in microcircuits. Microcircuits are used in many different applications, from hearing aids to dog tags, many of which require small-scale mechanical operations. MEMS, or microelectromechanical systems, have been developed to provide mechanical operations in microscopic environments.

Nevertheless, known small-scale transducers, or microactuators, are in may respects limited. They are somewhat bulky with respect to the circuits in which they operate. They also require considerable voltage to operate, and provide only a relatively small amount of mechanical force or displacement in return. The high voltage requirements of most known transducers make them unusable in CMOS circuits, as found in personal computers, which typically operate at 5 Volts or less. In addition, known microactuators are often subject to failure due to contamination, which makes them useless in many exposed environments. Additionally, many known microactuators are inflexible in design, and thus cannot be readily adapted to suit different applications. Known devices also must often be manufactured through special processes that require entirely different equipment and procedures from those used to form a circuit.

One example of a known microactuator is a "U" shaped actuator, with a "hot" arm and a "cold" arm. Both arms have an anchored end and a free end. Each anchored end is fixed to a substrate and the free ends of the two arms are connected together by a thin member. The hot arm is a relatively thin member and the cold arm is a relatively thick member. Both arms have a thin flexure near the anchored end. The actuator is triggered by applying an electric current through the actuator, from anchor to anchor. The thin, hot arm has a higher current density than the thick, cold arm, due to its comparatively smaller cross-sectional area. The high current density causes the hot arm to heat and expand more than the cold arm. Because the arms are connected at the free end, the differences in expansion causes the actuator to bend such that the free end moves along an arc. This actuator functions in a manner similar to a bimetallic strip, in which the different expansion properties of the two metals cause the strip to curl. Multiple "U" shaped actuators may be connected to a common actuating structure form an array that compounds their output forces. This is accomplished by attaching a flexible yoke between the free end of the actuator and the common actuating structure. This flexible yoke is required to translate the arc-like motion into a linear actuation.

While this configuration does provide functional force and displacement characteristics, the "U" shaped actuator possesses multiple deficiencies. For example, arc incurred losses during conversion of the arcing output motion into linear translating motion. More specifically, the actuators in the array must expend a portion of their output energy to deform the flexible yokes so that the common actuating structure moves in a straight line. Additionally, the cold arm's bulky size resists deflection as the hot arm arcs towards the cold arm. The force required to bend the cold arm does not contribute to the ultimate output force at he "U" shaped microactuator. Furthermore, the cold arm requires material, volume, and energy but does not contribute to the actuating force. The noncontributing material, volume, and energy become even more burdensome when multiple "A" shaped actuators are connected to form an array. The flexible yoke members similarly require energy, material, and volume without contributing to the output force produced by the actuator. Thus, the bulk and energy requirements fo the "U" shaped actuator make such actuators unsuitable for certain applications.

Accordingly, a need exists for a microactuator that can provide a high output force and high displacements, while operating at a low input voltage. Furthermore, the actuator should be lightweight and small, and should continue to operate in the presence of contaminants common in microcircuit applications. The microactuator should have a flexible design that can be easily adapted to suit various input, output, size, and material specifications. Moreover, the microactuator should be simple and easy to manufacture, preferably through methods similar to those used to make the circuits in which they operate.

BRIEF SUMMARY OF THE INVENTION

The present micromechanism includes a microactuator that has advantageous size, displacement, and force characteristics. The micromechanism may comprise a generally long and thin expansion member that is coupled at a first end to a base member and at a second end to a displaceable shuttle. In one embodiment, the expansion member extends towards and the shuttle at an angle slightly offset from a perpendicular attachment to the base member. The expansion member may be configured to elongate in an elongation direction. The shuttle may be configured to travel in an output direction along a single axis. The displaceable shuttle may be constrained such that the lateral distance between the base member and the axis of shuttle's output direction is fixed. This output direction is substantially different from the elongation direction of the expansion member. In one embodiment, the shuttle travels in a direction nearly perpendicular to the elongation direction of the expansion member. The expansion member is comprised of a material that can be formed microscopically. The material and shape of the expansion member may be selected such that substantial elongation occurs when thermal energy increases in the expansion member.

Upon an increase of thermal energy within the expansion member, the expansion member elongates in a direction nearly perpendicular to the base member and shuttle. Since the lateral offset of the base member and shuttle is constant, the expansion member cannot expand perpendicular to the shuttle. The expansion member's movement at the base member coupling is limited to slight angular rotation and movement at the shuttle coupling is limited to the uniaxial travel of the shuttle. These limitations may force the expansion member to pivot near the base member end and drive the shuttle at the shuttle end. Relative motion between the base member and the shuttle permits pivoting of the expansion member such that the increased length of the expansion member can be accommodated. The result is that a relatively small elongation of the expansion member creates a large displacement of the shuttle.

The microactuators disclosed herein may function substantially in-plane, which entails operation of each component within a single plane. Thus, the microactuator may be made through film deposition methods similar to those used to construct flat circuits. In fact, a microactuator according to the invention may even be made simultaneously and unitarily with a circuit so that production can be econoznically and rapidly carried out. The low voltage requirement makes such microactuators operative for CMOS applications and the like, and their high force/displacement characteristics make them uniquely suited to other applications in which efficient motion is desirable. In addition, the simple design of the microactuators of the present invention enables them to continue operating even in the presence of small contaminants often found in circuit environments.

The purpose, function, and advantages of the present mechanism will become more fully apparent from the following description and appended claims, or may be learned by the practice of the invention as set forth hereinafter.

DETAILED DESCRIPTION OF THE INVENTION

The present device will be best understood by reference to the drawings, wherein like parts are designated by like numerals throughout. It will be readily understood that the components of the present mechanism, as generally described and illustrated in the Figures herein, could be arranged and designed in a wide variety of different configurations. Thus, the following detailed description of the embodiments of the apparatus and method, as represented in FIGS. 1 through 7, are not intended to limit the scope of the claimed mechanism, but are merely representative of present embodiments of the mechanism.

Figure 1:
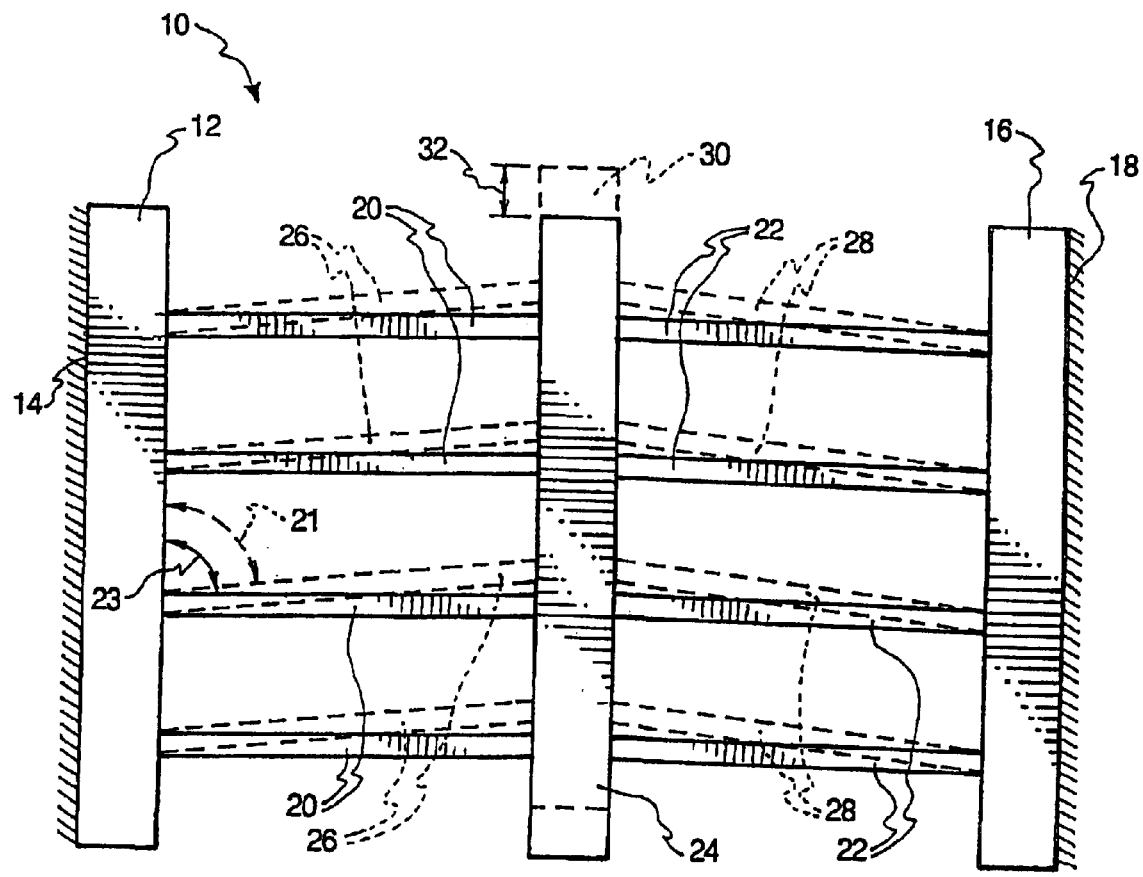
FIG. 1 is a plan view of one embodiment of a microactuator with having symmetrical sets of expansion members configured to drive a single shuttle.

FIG. 1 depicts a mnicroactuator with enhanced force and displacement characteristics. A datum 4 has been established to provide orientation throughout the application. The datum shows negative 5 and positive 6 X directions ("lateral directions") and negative 7 and positive 8 Y directions ("longitudinal directions"). The respective locations of the various elements of the mnicroactuator may be more precisely defined by referring to the datum 4. The microactuator 10 has a first base member 12 anchored to a first surface 14 and a second base member 16 anchored to a second surface. In one embodiment, the surfaces 14, 18 may be parts of the substrate of a silicon chip or, in an alternative embodiment the surfaces 14, 18 may be parts of one or more other microelectromechanical mechanisms. Two sets of expansion members 20, 22 are coupled to the base members 12, 16 respectively. The expansion members 20, 22 may be generally elongated and are composed of a thermally expanding material. The expansion members 20, 22 extend from the base members 12, 16 and are coupled to a shuttle 24 to create a ladder shaped actuator.

The first expansion members 20 are attached to the first base member 12. The first expansion members 20 extend in the positive X direction 6 and are coupled to a side of the shuttle 24. Similarly, the second expansion members 22 extend from the second base member 16 in the negative Y direction 5 and are coupled to the shuttle 24 opposite the first expansion members 20. The shuttle 24 may be generally stiff, and may be slidably disposed on a surface such as a semiconductor substrate. In FIG. 1, the shuttle 24 is only constrained by the expansion members 20, 22. The tensile and compressive strengths of the expansion members 20, 22 substantially limit the movement of the shuttle to displace in the positive 8 and negative 7 Y directions. Thus, the lateral distance in the X directions 5, 6 between the base members 12, 16, and the shuttle 24 does not change significantly during operation of the actuator 10. FIG. 1 further depicts the shuttle 24 and base members 12, 16 as rectangular in shape, but one skilled in the art will recognize that these elements may be configured in any number of shapes to fit a particular design need.

While FIG. 1 demonstrates a preferred embodiment of present invention, an operable microactuator may be formed with a single expansion member 20 coupled to a single base member 12 and a shuttle 24. The expansion member 20, the base member 12, and shuttle 24 form an "T" shaped actuator. Thus, any disclosure referring to multiple expansion members or groups of expansion members in the application may simply be replaced with a single expansion member to provide additional alternative embodiments of the invention. However, even though the micromechanism is operable with only a single expansion member, an increased number of expansion members will correspondingly increase the output force of the device. Thus, the microactuator of FIG. 1 will have a larger output force than an "T" shaped actuator with single expansion member. This relationship between the output force and the number of expansion members provides the microactuator of FIG. 1 with a large variety of versatile design options. The microactuator 10 can be simply optimized by adding or removing expansion members so that the microactuator 10 only outputs the required force for the actuating function. Thus, the overall size and energy consumption of the microactuator 10 can be minimized.

The individual elements of the ladder shaped actuator 10 in FIG. 1 or the "I" shaped actuator described above, which is a subset of the microactuator 10, may be attached to each other by multiple methods, such as chemical or adhesive bonding, integral formation, mechanical attachment, or the like. In one embodiment, the microactuator 10 is a compliant mechanism. In a compliant mechanism, the base members 12, 16, the expansion members 20, 22, and the shuttle 24 form a single continuous, unitary structure. Compliant mechanisms are a family of devices in which flexible and bendable members replace convention multi-part devices, such as pin joints. They provide several benefits including simple manufacturing, high strength, and flexibility. Moreover, a compliant mechanism is typically constructed in unitary fashion. For example, the various components of the embodiment of FIG. 1 may be formed from one or more planar layers of polysilicon. The motion of the microactuator 10 is determined by its geometry. Thick members, such as the base members 12, 16 and the shuttle 24, will stay rigid. Conversely, thin or necked-down members, such as the expansion members 20, 22, will flex. In FIG. 1, the expansion members 20, 22 are thin flexible members; however, where practical, they may be necked-down to form small length flexural pivots to obtain flexibility. Thus, the compliant nature of the expansion members 20, 22 provides the motion of the microactuator 10.

The expansion members 20, 22 also supply actuating force for the mnicroactuator 10. The expansion members 20, 22 are preferably made from a material with a high coefficient of thermal expansion (ratio of thermal expansion to temperature change) to obtain large displacements. However, a material with a lower coefficient or thermal expansion may be used when smaller displacements are desirable. The high coefficient allows for comparatively large elongation of the expansion members 20, 22 when the amount of thermal energy increases within the expansion members 20, 22.

When thermal energy increases in the expansion members 20, 22, they elongate. However, as stated above, the lateral distance between each of the base members 12, 16 and the shuttle 24 is fixed. Consequently, as the first expansion members 20 elongate in the positive X direction 6, the compressive strength of the second expansion members 22 prevents the shuttle 24 from moving in the positive X direction 6. Likewise, as the second expansion members 22 elongate in the negative X direction 5, the compressive strength of the first expansion members 20 prevent the shuttle 24 from moving in the negative X direction 5. The result of these constraints is that the expansion members 20, 22 drives the shuttle 24 along the Y-axis 7, 8. This biasing occurs as the expansion members 20, 22 bend or pivot from a first attachment angle 23, to a second attachment angle 21, with respect to the base members 12, 16. The first attachment angle 23 maybe substantially perpendicular, or close to 90°. Substantially parallel may be a ±15° offset from a true perpendicular attachment without diverging from the spirit of the embodiment. The second attachment angle 21 may be somewhat further from perpendicularity. The trigonometric effect of the decrease in the attachment angle displace the shuttle 24 in the positive Y direction 8 so that the expansion member can elongate.

Applying simple trigonometry to the actuator structure 10 in FIG. 1 demonstrates that if the first attachment angle 23 is assumed to be nearly perpendicular or close to 90°, then each of the expansion members 20, 22 at the second attachment angle 21 will form a hypothenuse of a right triangle in which the non-elongated expansion member 20 or 22 and the portion or the shuttle 24 between the couplings of the hypothenuse 26 or 28 and the non-elongated expansion members 20 or 22 form the other two sides of the triangle. The Pythagorean Theorem holds that the hypothenuse 26 or 28 is longer than the adjacent side 20 or 22. Thus, as elongation of the expansion members 20, 22 forces the attachment angle to decrease, the expansion members 20, 22 then move from the adjacent position of the right triangle to the hypothenuse position 26, 28. This angle decrease drives the attached shuttle 24 along the Y-axis 7, 8 to a displaced position 30. Thus, elongation of the expansion members 20, 22 almost completely in the X direction 5, 6 produces a displacement 32 of the shuttle 24 in the Y direction 8. Therefore, the elongation direction and the shuttle output direction are substantially different directions. It is important to understand, however, that a substantially different direction is not limited to a near 90° difference in directions. Various embodiments of the microactuator may only require small differences in direction. The difference between the elongation and output directions will depend on the desired force and displacement characteristics of the actuator.

An elongation direction that is completely perpendicular to the output direction may present some directional control problems; hence some departure from the perpendicular attachment may be needed. Thus, the microactuator 10 of FIG. 1 implements an initial angular offset of the expansion members 20, 22 to control the actuation direction. By offsetting the expansion members 20, 22 such that the first attachment angle 23 is slightly less than 90°, elongation of the expansion members 20, 22 will displace the shuttle 24 in the positive Y direction 8. While comparatively large angle offsets will guarantee a predictable displacement direction, positioning the expansion members 20, 22 at a near perpendicular angle provides a greater output displacement 32.

An advantage of the microactuator 10 over other designs is the ability to select a wide range of actuation force and displacement characteristics. The largest shuttle displacement occurs when the expansion members elongate in a direction nearly perpendicular to the direction of travel of the shuttle 24. However, this displacement comes at the expense of force. The output force can be increased by offsetting the attachment of the expansion member from a perpendicular configuration. The output force will increase as the offset increases, but the displacement distance Will correspondingly decrease. Therefore, the first attachment angle 23 may be selected according to the force and displacement requirements for the application in which the microactuator 10 is to be used. Alternatively, additional expansion members 20, 22 can simply be added to a microactuator 10 to increase the output force while maintaining a desired output.

A beneficial feature of this design is that a relatively small elongation of the expansion members 20, 22 can produce a shuttle displacement over ten times larger than the elongation of the expansion members 20, 22. The displacement of the shuttle 24 as a function of the elongation of expansion members 20, 22 can be derived from Pythagorean theorem, assuming the unelongated expansion members 20, 22 are nearly perpendicular to the base members 12, 16 and the shuttle 24. As the expansion members 20, 22 elongate, they depart further from perpendicularity. The following equation may be used to obtain the output displacement of the shuttle 24 and variables are as follows:

$$\Delta = \sqrt{(L_2)^2 - (L_1)^2}$$

$\Delta$ is the displacement of the shuttle 24 in the output direction;

$L_1$ is the unelongated length of the expansion members 20, 22; and $L_2$ is the elongated length of the expansion members 20, 22.

This equation measures the length of the unelongated and elongated expansion members as the distance from the base member attachment to the shuttle attachment. This measurement may vary somewhat from the actual length of the expansion member if bending or buckling occurs in the member. A ratio ($R_1$) of displacement to elongation can be obtained through the following equation.

$$R_1 = \left(\frac{\Delta}{L_2 - L_1}\right)$$

A more robust equation may also be employed to characterize the operation of the microactuator 10 without requiring unelongated expansion members 20, 22 to have a near perpendicular attachment. Such an equation may be obtained by referencing the unelongated and the elongated expansion members 20, 22 to theoretical expansion members (not shown) exactly perpendicularly fixed between the base members 12, 16 and the shuttle 25 24. The length of this theoretical member is the fixed lateral distance between each of the base members 20, 22 and the shuttle 24. This equation provides the output displacement of the shuttle 24 for any of a large range of values of the first attachment angle 23. The equation and variables are as follows:

$$\Delta = \left[L_2 \cdot \sin\left(\arccos\left(\frac{L_0}{L_2}\right)\right)\right] - \left[L_1 \cdot \sin\left(\arccos\left(\frac{L_0}{L_1}\right)\right)\right]$$

$\Delta$ is the displacement of the shuttle 24 in the output direction;

$L_0$ is the fixed lateral distance between the base member 12 or 16 and the shuttle 24;

$L_1$ is the unelongated length of the expansion members 20, 22; and $L_2$ is the elongated length of the expansion members 20, 22.

This equation is derived from the trigonometric relationships of two right triangles that share the same base, the common base being the fixed lateral distance ($L_0$). The physical constraints must be considered in performing calculations with the above equation. The previous equation functions when the first attachment angle 23 is within 90° of the fixed lateral length.

A shuttle displacement to elongation ratio ($R_2$) may be calculated in the same manner as above:

$$R_2 = \left(\frac{\Delta}{L_2 - L_1}\right)$$

The previous two equations demonstrate that the displacement of the shuttle 12 is more than two times larger than the elongation of expansion members 20, 22, even with a first attachment angle 23 less than 45°. Although, the highest displacement ratios occur when the first attachment angle 23 is near 90°, these equations demonstrate that high displacement to elongation ratios occur throughout a large range of values of the first attachment angle 23. However, smaller displacement to elongation ratios can also be obtained through application of the present invention. Multiple applications may require such small displacements. This discussion is not intended to limit the invention to any displacement to elongation ratio.

The microactuator 10 may have comparatively low energy consumption which is due in part to the linear path of the expansion members 20, 22. More specifically, each of the expansion members 20, 22 has one end coupled to the shuttle 24; these coupled ends move in a substantially linear path as the microactuator 10 operates. Because the most efficient path between to points is a straight line, the linear travel of the coupled ends is more efficient than any other path, such as an accurate, elliptical, or otherwise nonlinear path.

The substantially straight shape of the expansion members 20, 22 may also add to the efficiency of the microactuator 10. Bending consumes energy; consequently, eliminating bending from a system will increase the efficiency of the system. Therefore, a generally stiff member is more efficient than an extremely flexible member. The stiffness (k) of a beam may be calculated using the linear spring constant:

$$k = \frac{3EI}{L^3}$$

k is the stiffness;

E is Young's modulus, which is a material property,

I is the moment of area of the cross-section of the beam; and

L is the beam length.

Assuming a given cross-sectional moment (I) and a given value of Young's modulus (E), the shortest member (L) will be the stiffest. Therefore, because the shortest distance between two points is a straight line, the substantially straight elongation member 20, 22 is the stiffest and consequently, consumes less energy than a non-straight member. Stiffness, as discussed above, does not require absolute rigidity, but simply entails sufficient rigidity to substantially avoid deflection that is not necessary for the motion of a microactuator.

While FIG. 1 depicts a substantially straight elongated expansion member 26, 28, this embodiment represents an ideal elongation in which flexibility is limited to the points at which the expansion members 26, 28 are coupled to the base members 12, 16 and the shuttle 24. This ideal elongation would require pin joints or necked-down cross-sections that permit flexing of the expansion members 20, 22 only at the ends of the expansion members 20, 22. Maintaining a substantially straight expansion member may not be as simply accomplished when the expansion member is attached without necked-down section or pivot joints. In a compliant embodiment, in which the base members 12, 16, the expansion members 20, 22, and the shuttle 24 are a single continuous device, flexibility at the attachment points may be low. Therefore, bending at or near the attachment points will not occur as readily. In a member that is fixed on two ends, the most probable location for bending to occur is in the center of the member's length, assuming the member has a constant cross-section.

Figure 2:
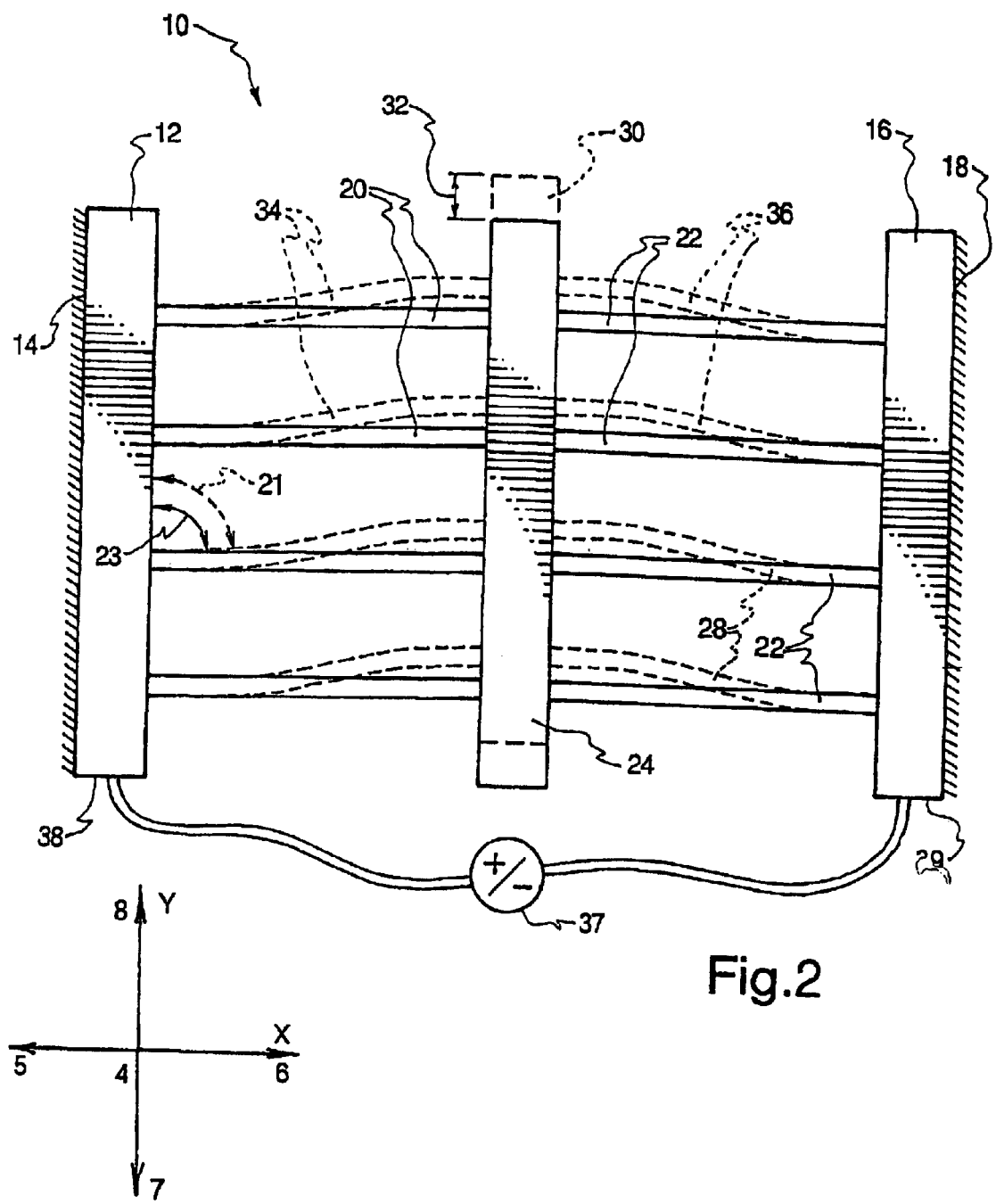
FIG. 2 is the plan view of the microactuator of FIG. 1, depicting one possible shape of elongated expansion members and one manner in which the microactuator may be connected to receive an electrical input.

FIG. 2 shows the microactuator 10 of FIG. 1, with an alternative mode of expansion member elongation. More specifically, the expansion members 20, 22 may have elongated configurations 34, 36 respectively. The elongated expansion members 34, 36 way bend in the center during elongation to for an "S" shape. Despite this flexing, the elongated expansion members 34, 36 still remain substantially straight in some aspects. The expansion members 34, 36 remain substantially straight at the attachment points and only begin to flex near the center of their length. Even in the bent region of the "S" shape, the curvature remains relatively small. Consequently, the manner in which the expansion members 34, 36 bend is more efficient than other bending modes such as arcuate bending, in which a greater degree of bending is present over a greater length. Thus, the microactuator 10 disclosed herein remains efficient despite some bending.

The flexure of the "S" shaped expansion members 34, 36 can also be understood as an elastically buckling process. As the expansion members 20, 22 elongate in the positive X 6 and negative X 5 direction respectfully, the fixed distance between the base members 12, 16 and the shuttle 24 forces the expansion members 20, 22 to elastically buckle. Elastic buckling is not a permanent deformation of the member; rather, the elongated expansion member 34, 36 temporarily yield under axial loads, but return to their original substantially unaffected state 20, 22 when the load is removed. In the embodiment in FIG. 2, the direction of the buckling is controlled by the first attachment angle 23 of the expansion members 20, 22 with respect to the base members 12, 16. The elongation and subsequent buckling drive the shuttle 24 in the positive Y direction 8.

The elongation of the expansion members 20, 22 may be initiated in a variety of manners. FIG. 2 illustrates that the base members 12, 16, have contact surfaces 38, 39, respectively, by which the base members 12, 16 are electrically coupled to a current source 37. In one embodiment, thermal energy in the expansion members 20, 22 is increased by an electrical current flowing through the expansion members 20, 22 from the current source 37. As the current passes through the expansion members 20, 22, the electrical resistance of the expansion members 20, 22 causes an increase in temperature. The temperature increase causes elongation of the expansion members 20, 22. Thus, in one embodiment of the present invention, the shuttle 24 actuates when a current passes through the microactuator. Once the current is removed, the amount of thermal energy decreases to an equilibrium state and the shuttle 24 returns to its original position An increase in the ambient temperature surrounding the microactuator 10, may also provide enough thermal energy in the expansion members 20, 22 to actuate the shuttle 24. The ambient temperature may be increased by disposing a heat generating device near the microactuator 10. Other methods of increasing thermal energy within the expansion members 20, 22, such as conduction and radiation may also be used to actuate the shuttle 24. Additionally, traditional methods of preventing heat loss maybe implemented in conjunction with the microactuator 10 to increase efficiency. An adequately insulated mechanism will require the addition of less thermal energy to provide actuation, and will remain in the actuated position with a lower steady state current input.

Figure 3:
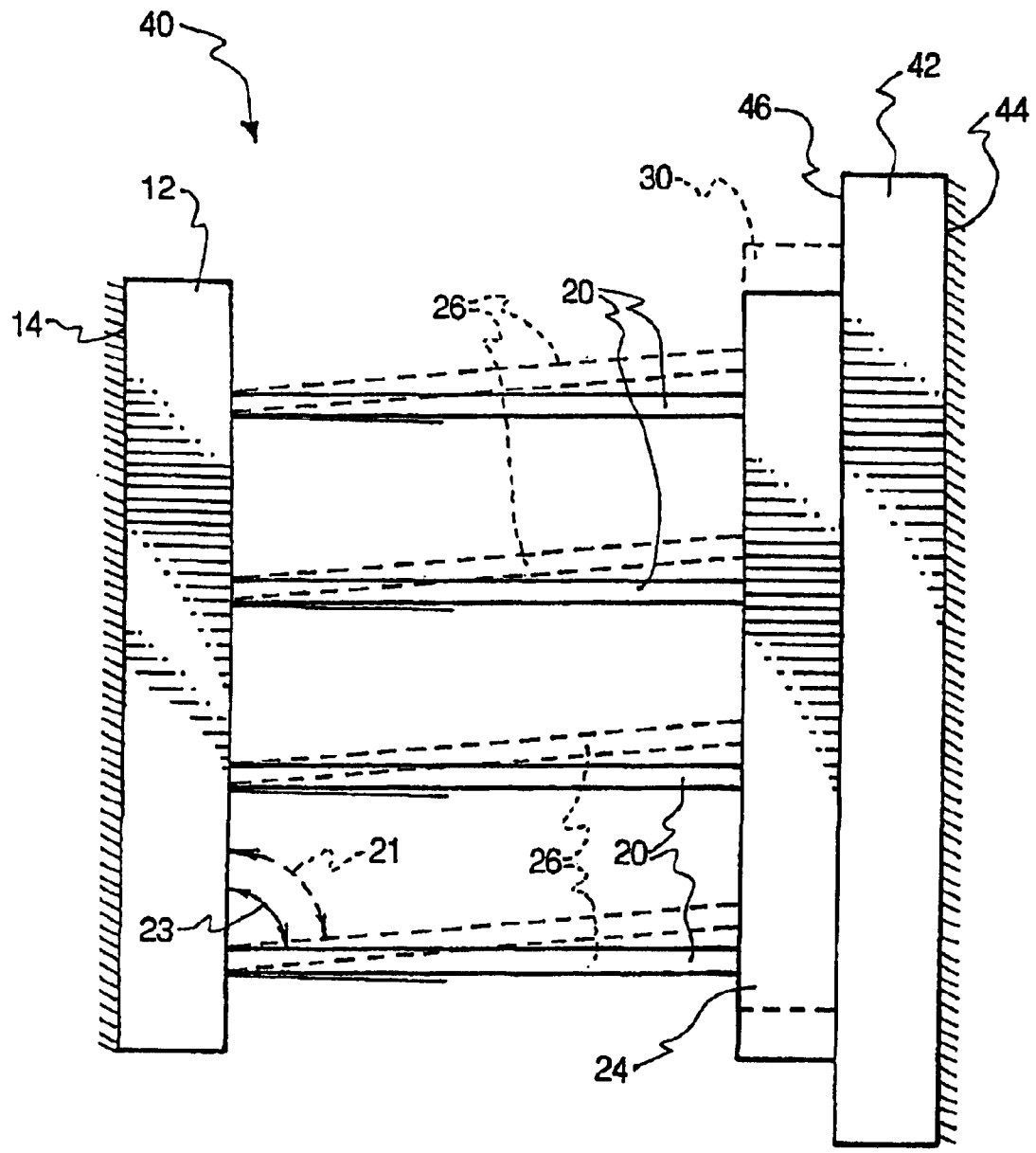
FIG. 3 is a plan view of an alternative embodiment of a microactuator in which only a single set of expansion members is used.

FIG. 3 demonstrates an alternative embodiment of a microactuator 40 according to the invention. The microactuator 40 may have only one set of expansion members 20. The shuttle 24 directly abuts the second base member 42 to restrict motion of the shuttle 24 in the positive X direction 6. The second base member 42 is anchored against a surface 44 (or another suitable anchoring feature) and in one embodiment, has a smooth surface 46 against which the shuttle 24 slides. The second base member 42 fixes the lateral distance between the first base member 12 and the shuttle 24. Thus, elongation of the expansion members 20 drive the shuttle in the positive Y direction 8. The microactuator 40 is more compact than other actuators, such as the microactuator 10, that have two sets of expansion members 20, 22. Therefore, the microactuator 40 requires less energy to actuate, but has a correspondingly lower output force. This embodiment 40 also has an "I" shape. Each of the four expansion members 20 forms an "I" shape in conjunction with the base member 12 and the shuttle 24.

In another embodiment, the second base member 42, need not be a fixed member, it simply must restrain movement of the shuttle 24 in the positive X direction 6. Consequently, a variety of structures may be used in place of the second base member 42. In one alternative embodiment, the abutting surfaces of the shuttle 24 and the second base 42 may be replaced with a rack-and-pinion type structure, so that the shuttle 24 can drive a gear or the like. Alternatively, the second base member 42 may be a member capable of sliding along the Y axis 7, 8, such as another shuttle 24. The contact surfaces between shuttle 24 and the second base member 42 need not be straight surfaces. Various shapes can be implemented that allow for travel in a combination of X 5,6 and Y 7, 8 directions.

Figure 4:
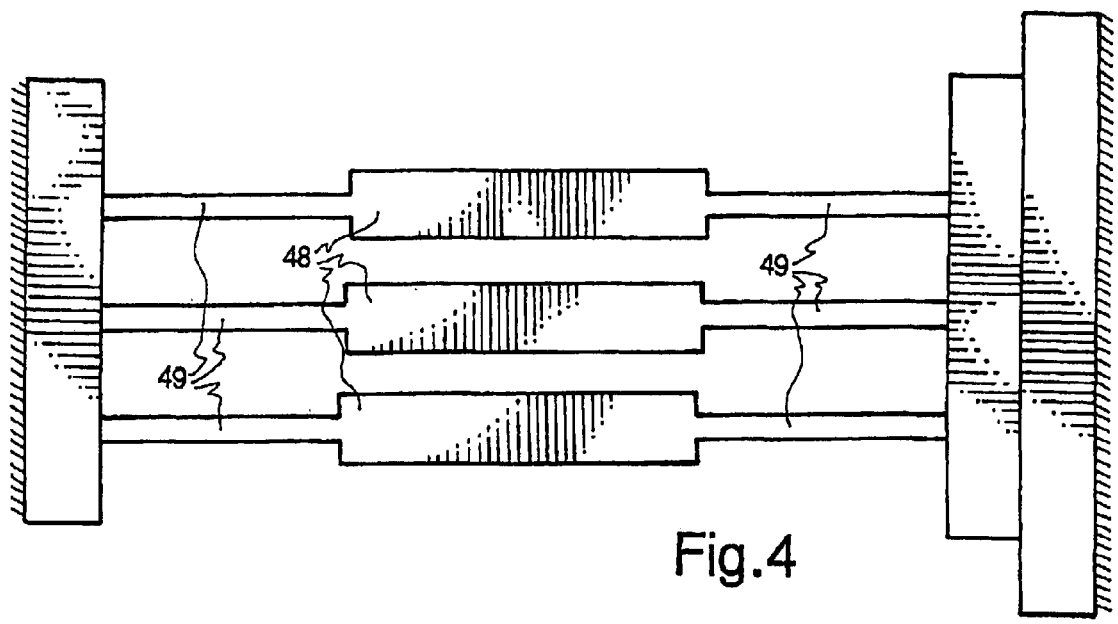
FIG. 4 is a plan view of another alternative embodiment of a microactuator, in which each expansion member has a variable width.

FIG. 4 illustrates an alternative embodiment of expansion members suitable for use in any of the microactuator designs of the present invention. Each of the expansion members 49 shown here has a variable width. The rectangular shapes of the expansion members 49 of FIG. 4 represent only one of many possible geometric structures that could be incorporated into the expansion members 49. The variable width geometry of the expansion members 49 may provide structural support so that the expansion members 49 can be made comparatively long. More specifically, the wide cross-section 48 prevents the expansion member 49 from plastically buckling, i.e. permanently deforming, when the mechanism is actuated. Additionally, various shaped cross-sections may also serve to control the manner in which the expansion member elastically buckles.

Figure 5:
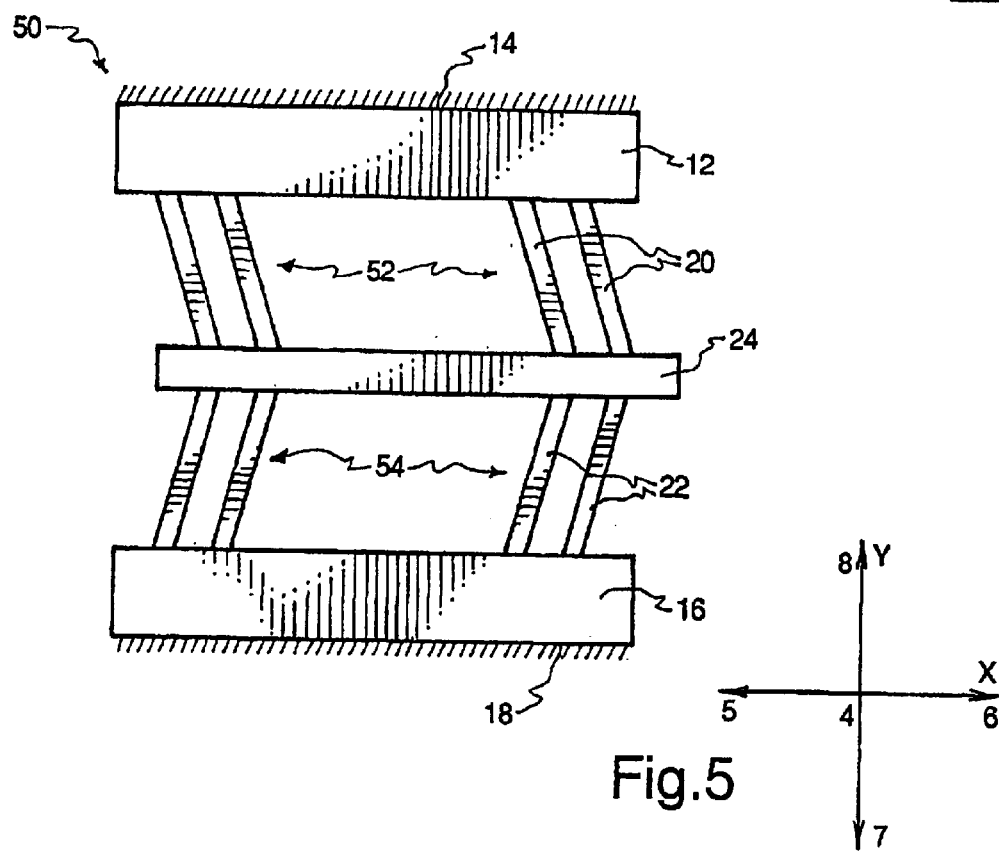
FIG. 5 is a plan view of another alternative embodiment of a microactuator, in which two symmetrical sets of expansion members are used, each of which contains two groups of expansion members.

FIG. 5 shows yet another embodiment of the present invention. The microactuator 50 of this embodiment is generally similar to the microactuator 10 of FIG. 1. However, in the microactuator 50, the expansion members 20, 22 have been gathered to form groups 52, 54. The effect of positioning the expansion members 20, 22 to form the groups 52, 54 is to reduce thermal energy losses because the expansion members 20, 22 thermally insulate each other. Actuation in a vacuum will also reduce energy requirements of a microactuator because thermal energy is not dissipated by convection. FIG. 5 also demonstrates an angle that has been shown in previous figures. The more accurate attachment clearly determines that the displacement direction of the shuttle 24 will be in the positive X direction 6.

Figure 6:
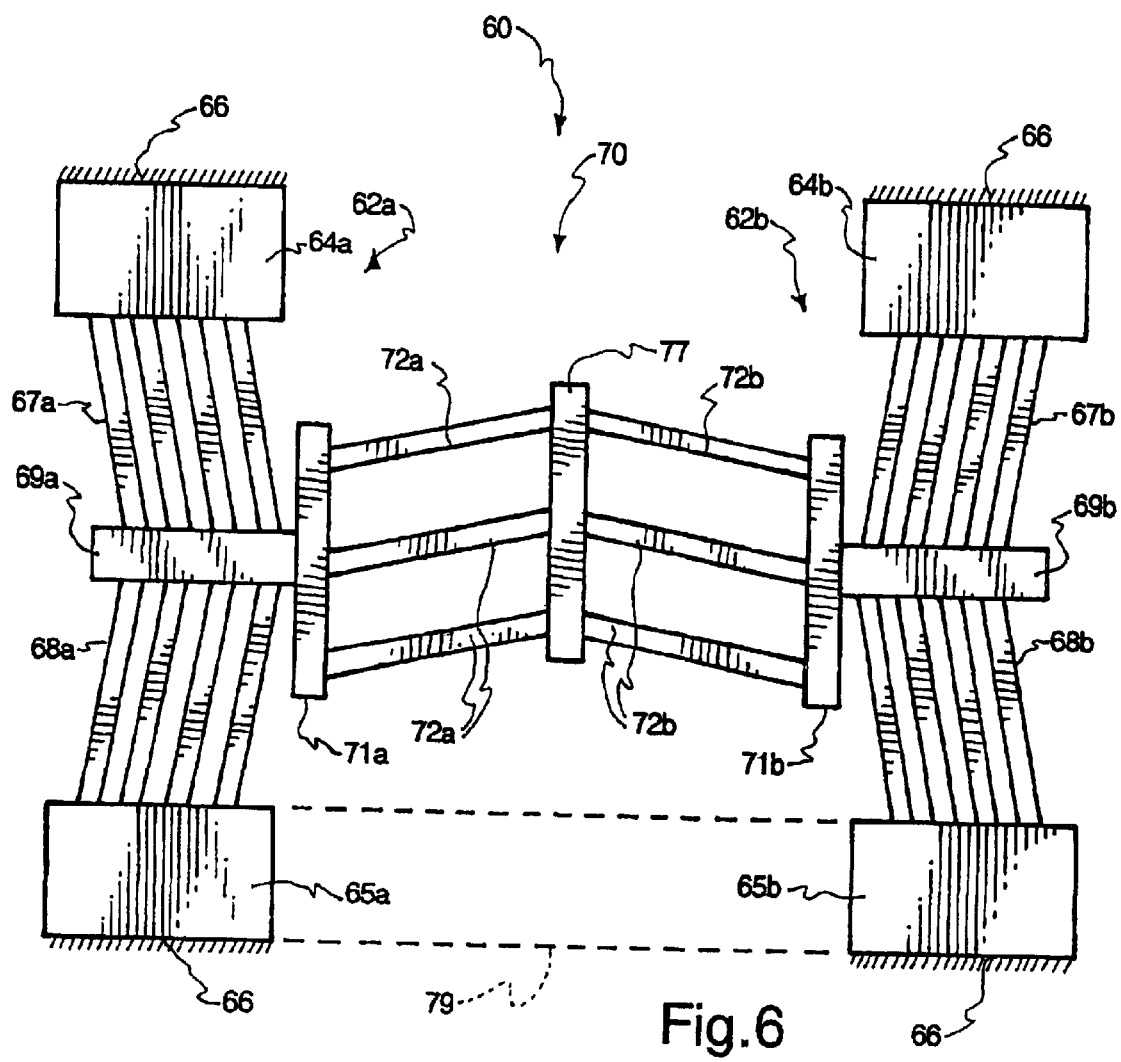
FIG. 6 is a plan view of an embodiment of an array of microactuator in which two microactuators press inward to amplify the motion of a third microactuator.

Referring to FIG. 6, an alternative embodiment shows multiple microactuators arrayed to form a single mnicroactuator 60. This microactuator 60 is configured to provide a larger output displacement and/or force than a single microactuator would be capable of providing. FIG. 6 shows two transient microactuators 62a, 62b that are similar to the microactuator 10 depicted in FIG. 1. The first transient microactuator 62a has two base members 64a, 65a that may be fixed to a substrate 66. In the embodiment shown, multiple primary expansion members 67a, 68a are coupled to the base members 64a, 65a respectively. As in other embodiments, the actuation direction of the first transient microactuator 62 can be controlled by disposing the expansion members 67a, 68a at an offset angle from the base member 64a, 65a. The embodiment of FIG. 6 shows the expansion members 67a, 68a coupled to a transient shuttle 69a, with the expansion member 67a, 68a angling toward a biasing actuator 70. The transient shuttle 69a is driven in a positive X direction 6 when the expansion members 67a, 68a elongate. The transient shuttle 69a is coupled to a first base member 71a of the biasing actuator 70.

A second transient microactuator 62b is coupled to a second base member 71b of the biasing actuator 70. Two sets of primary expansion members 67b, 68b are coupled between two base members 64b, 65b and a second transient shuttle 69b of the second transient actuator 62b. Elongation of the primary expansion members 67b, 68b drives the second transient shuttle 69b in a negative X direction 8 (the direction opposite the travel direction of the first transient shuttle 69a). The displacement of the transient shuttles 69a, 69b decreases the lateral distance between the actuating shuttle 77 and base members 71a, 71b of the actuating shuttle. The decrease in lateral distance drives the actuating shuttle 77 in the Y direction 8. More specifically, the motion of the two transient shuttles 69a, 69b forces two sets of secondary expansion members 72a, 72b to pivot or bend, driving the actuating shuttle 77 in the positive Y direction 8. Alternatively, the secondary expansion members 72a, 72b can actuate the actuating shuttle 77 in a manner similar to the expansion members 20, 22 of the microactuator 10 of FIG. 1, even if none of the primary expansion members 67a, 67b, 68a, 68b have elongated.

The largest displacement occurs when all of the expansion members 67a, 67b, 68a, 68b, 72a, 72b are simultaneously elongated This will produce a larger output force and displacement than would be present if only the primary expansion members 67a, 67b, 68a, 68b, or the secondary expansion members 72a, 72b, were utilized. The microactuators 10, 40, 50 may be arrayed in various other combinations to amplify the displacement of a shuttle by using the shuttle of one microactuator 10, 40, 50 as a base member attachment for another microactuator 10, 40, 50. The microactuator 50 of FIG. 6 also demonstrates that several advantages may be derived from affixing base members of a microactuator 10, 40, 50.

The actuation of the microactuator 60 of FIG. 6 may be controlled through selectively applying electric current to the base members 64a, 64b, 65a, 65b, 71a, 71b. More specifically, the primary expansion members 67a, 68a of the first actuator 62a may be elongated by applying a current source to the base members 64a, 65a. The current then flows between the two base members 64a, 65a via the expansion member 67a, 68a, to heat, and thereby elongate, the expansion members 67a, 68a. A similar process may be used to elongate the expansion members 67b, 68b of the second actuator 62b. A current source may be coupled to the base members 67b, 68b such that the current flows through, heats, and elongates the expansion members 67b, 68b.

The secondary expansion members 72a, 72b may be elongated by coupling a current source to the lower base members 65a, and 65b. The current flowing between the base members 65a, 65b similarly flows through, heats, and elongates the expansion members 72a, 72b. Thus, three different current sources may be coupled to the microactuator 60 to control the energy consumption and actuation sequence. However, a single current source may alternatively be used to actuate the microactuator 60 by electrically connecting the two lower base members 65a, 65b such that current can shunt between the base members 65a, 65b. This may be accomplished by, for example, replacing the lower base members 65a, 65b with a single elongated base member 79. A single current source may then be coupled to the upper base members 64a, 64b to actuate the entire microactuator 60. Other current source coupling schemes may be implemented in the microactuator 60 or in other microactuator arrays to suit a large variety of control needs.

Figure 7:
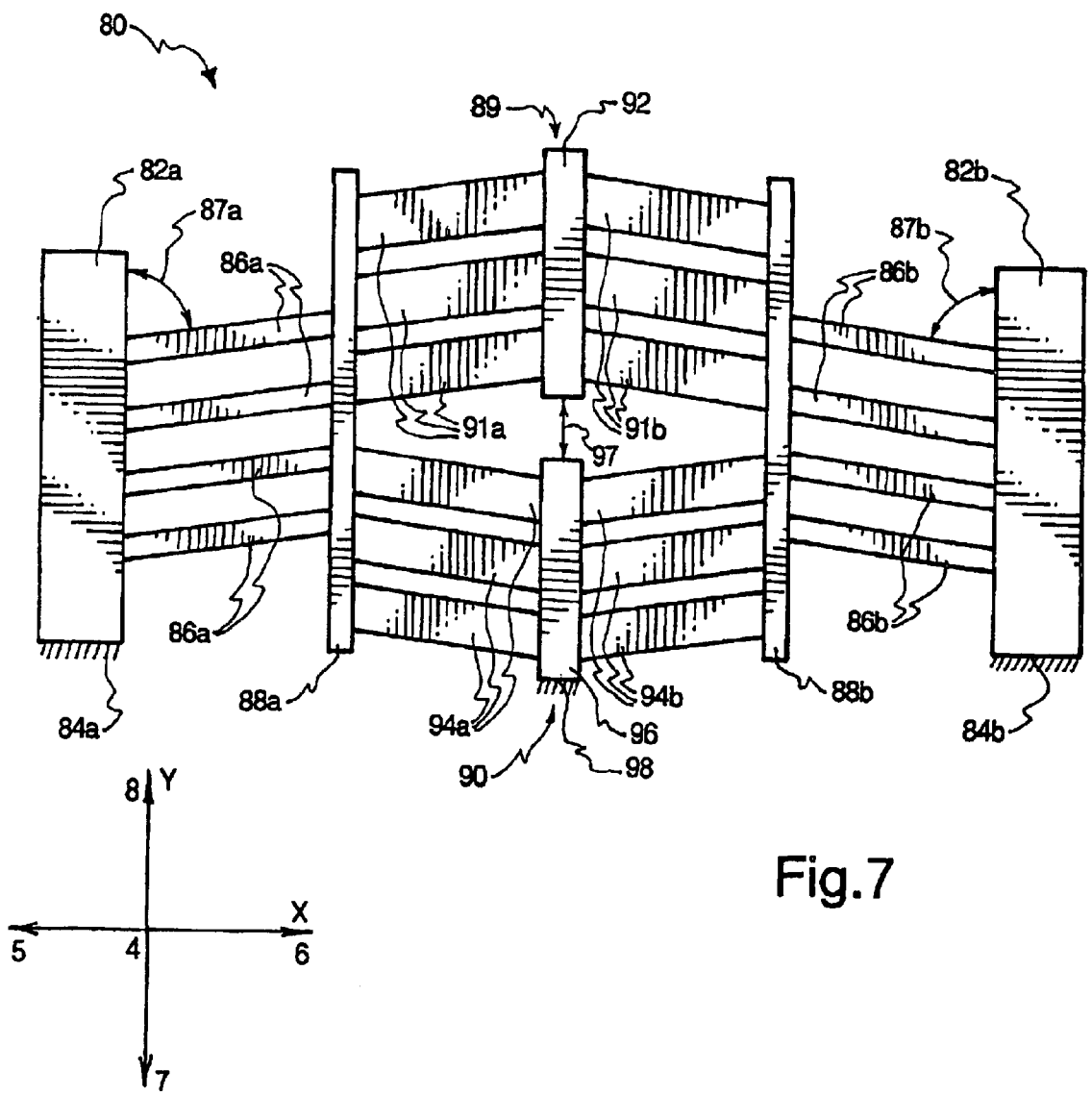
FIG. 7 is a plan view of another embodiment of an array of the microactuator, in which two microactuators press inward against an anchored microactuator and an unanchored microactuator to amplify the motion of the unanchored microactuator.

FIG. 7 illustrates an alternative embodiment of a microactuator 80 that implements multiple microactuators to obtain compound force and displacement characteristics. The microactuator 80 is based at least in part on the sliding microactuator 40 shown in FIG. 3. A first base member 82a is fixed to a surface 84a. At least one primary expansion member 86a is coupled to the base member 82a. The primary expansion members 86a are coupled to a first transient shuttle 88a. A similar base member 82b and expansion member 86b structure is coupled to a second transient shuttle 88b. In one embodiment, the expansion members 86a, 86b are angled from an orthogonal intersection with the base members 82a, 82b. The two transient shuttles 88a, 88b serve as base members for a biasing actuator 89 and an anchoring actuator 90. Secondary expansion members 91a, 91b are coupled between the transient shuttles 88a, 88b and a biasing shuttle 92. Again, in one embodiment the secondary expansion members 91a, 91b are angled from an perpendicular intersection with the transient shuttles 88a, 88b. Secondary, expansion members 94a, 94b are also coupled between the transient shuttles 88a, 88b and an anchoring shuttle 96.

The microactuator 80 functions in a manner similar to the other microactuators 10, 40, 50, 60 previously discussed. In one embodiment, the expansion members 86a, 86b, 91a, 91b, 94a, 94b are simultaneous elongated. The primary expansion members 86a, 86b elongate, biasing the transient shuttles 88a, 88b toward the biasing shuttle 92 and the anchoring shuttle 96. The motion of the transient shuttles 88a, 88b compresses the secondary expansion members 91a, 91b, 94a, 94b to transmit the biasing force to the actuating shuttle 92 and to the anchoring shuttle 96. The secondary expansion members 91a, 91b, 94a, 94b may simultaneously elongate to partially or fully resist inward motion of the transient shuttles 88a, 88b, and to create additional biasing force between the actuating shuttle 92 and the anchoring shuttle 96. The secondary expansion members 91a, 91b, 94a, 94b may be made thinner or thicker than the primary expansion members 86a, 86b to control the proportions of biasing force provided by the expansion members 86a, 86b, 91a, 91b, 94a, 94b.

As a result, the actuating shuttle receives force in the positive Y direction 8 and the anchoring shuttle 96 receives force in the negative Y direction 8. These opposing forces tend to increase the distance 97 between the biasing shuttle 92 and the anchoring shuttle 96. However, because the anchoring shuttle 96 is fixed in place, the actuating shuttle 92 receives all of the displacement 97. Thus, the comparatively small force and displacements of the expansion members 86a, 86b, 91a, 91b, 94a, 94b in the microactuator 60 may be combined to create a larger output force and displacement in the actuating shuttle 92. Similar results, but with a smaller force and displacement, will result if only the primary expansion members 86a, 86b are elongated.

The microactuators disclosed herein may be modified in many other ways to suit a wide variety of applications. The invention may be embodied in other specific forms without departing from its structures, methods, or other essential characteristics as broadly described herein and claimed hereinafter. The described embodiments are to be considered in all respects only as illustrative, and not restrictive. The scope of the intellectual property rights is, therefore, indicated by the appended claims, rather than by the foregoing description. All changes that come within the meaning and range of equivalency of the claims are to be embraced within their scope.

What is claimed is:

1. A microelectromechanical mechanism comprising:
   a base member;
   a shuttle; and
   a substantially straight expansion member attached to the base member and the shuttle, such that the base member, the shuttle, and the expansion member substantially form an "I" shape, wherein the expansion member is configured to elongate in an elongation direction to drive a shuttle in a direction substantially different from the elongation direction.

2. The microelectromechanical mechanism of claim 1, further comprising:
   a second base member; and
   a second substantially straight expansion member attached to the second base member and the shuttle, such that the second base member, the shuttle, and the second expansion member substantially form an "I" shape.

3. The microelectromechanical mechanism of claim 1, wherein the shuttle is configured to act as a base member for a second microelectromechanical mechanism comprising a second shuttle and a second substantially straight expansion member wherein a second shuttle of the second microelectromechanical mechanism has an amplified displacement.

4. The microelectromechanical mechanism of claim 1, wherein the shuttle abuts a surface, the surface guiding a direction of travel of the shuttle.

5. The microelectromechanical mechanism of claim 4, wherein the surface comprises a plurality of teeth, the shuttle comprising teeth, configured to mesh with the teeth of the surface.

6. The microelectromechanical mechanism of claim 4, wherein the surface is substantially smooth.

7. The microelectromechanical mechanism of claim 1, wherein elongation of the expansion member is induced by an electrical current passing through the expansion member.

8. The microelectromechanical mechanism of claim 1, wherein the fixed base member and the shuttle are electrically coupled to an electrical current source.

9. The microelectromechanical mechanism of claim 2, wherein at least two base members are electrically coupled to an electrical current source.

10. A microelectromechanical mechanism comprising:
    a substantially straight expansion member comprising a first and a second end;
    a base member attached to the first end of the substantially straight expansion member; and
    a shuttle attached to the second end of the substantially straight expansion member, such that the expansion member is able to elongate in an elongation direction to bias the shuttle in an output direction substantially different from the elongation direction.

11. The microelectromechanical mechanism of claim 10, further comprising:
    a second base member; and
    a second substantially straight expansion member comprising a first end attached to the second base member and a second end attached to the shuttle.

12. The microelectromechanical mechanism of claim 10, wherein the shuttle is configured to act as a base member for a second microelectromechanical mechanism comprising a second shuttle and a second substantially straight expansion member wherein a second shuttle of the second microelectromechanical mechanism has an amplified displacement.

13. The microelectromechanical mechanism of claim 10, wherein the shuttle abuts a surface, the surface guiding a direction of travel of the shuttle.

14. A microelectromechanical mechanism comprising:
    an expansion member comprising a first end and a second end;
    a base member attached to the first end of the expansion member; and
    a shuttle attached to the second end of the expansion member, such that elongation of the expansion member in an expansion direction induces motion of the shuttle in an output direction, wherein elongation of the expansion member further induces buckling of the expansion member.

15. The microelectromechanical mechanism of claim 14, wherein the expansion member is configured to buckle elastically.

16. The microelectromechanical mechanism of claim 14, wherein the expansion member is configured to substantially buckle in an "S" shape.

17. The microelectromechanical mechanism of claim 14, further comprising:
    a second base member; and
    a second substantially straight expansion member comprising a first end attached to the second base member and a second end attached to the shuttle.

18. The microelectromechanical mechanism of claim 14, wherein the shuttle is configured to act as a base member for a second microelectromechanical mechanism comprising a second shuttle and a second expansion member wherein a second shuttle of the second microelectromechanical mechanism has an amplified displacement.

19. The microelectromechanical mechanism of claim 14, wherein the shuttle abuts a surface, the surface guiding a direction of the travel of the shuttle.

20. A microelectromechanical mechanism comprising:
    an expansion member comprising a first end configured to be attached to a structure and a second end configured to travel in a substantially linear path during elongation of the expansion member in an expansion direction; and
    a shuttle connected to the second end such that the second end is able to bias the shuttle in an output direction in response to elongation of the expansion member.

21. The microelectromechanical mechanism of claim 20, further comprising:
    a second expansion member comprising a first end configured to be fixed in place and a second end configured to travel in a substantially linear path during elongation of the second expansion member in an expansion direction.

22. The microelectromechanical mechanism of claim 20, wherein the shuttle is configured to act as a structure to attach a second microelectromechanical mechanism comprising a second shuttle and a second expansion member wherein a second shuttle of the second microelectromechanical mechanism has an amplified displacement.

23. The microelectromechanical mechanism of claim 20, wherein the shuttle abuts a surface, the surface guiding a direction of travel of the shuttle.

24. The microelectromechanical mechanism of claim 20, wherein elongation of the expansion member is induced by an electrical current passing through the expansion member.

25. A microelectromechanical mechanism comprising:
    a base member;
    a shuttle; and
    an expansion member comprising a first end and a second end, the first end substantially perpendicularly attached to the base member and the second end substantially perpendicularly attached to the shuttle, the expansion member is able to elongate in an elongation direction to bias the shuttle in an output direction substantially different from the elongation direction.

26. The microelectromechanical mechanism of claim 25, wherein the first end is attached to the base member at an angle less than ±15 degrees from exactly perpendicular attachment.

27. The microelectromechanical mechanism of claim 25, further comprising:
   a second base member; and
   a second expansion member comprising a first end substantially perpendicularly attached to the second base member and a second end substantially perpendicularly attached to the shuttle.

28. The microelectromechanical mechanism of claim 25, wherein the shuttle is configured to act as a base member for a second microelectromechanical mechanism comprising a second shuttle and a second expansion member wherein a second shuttle of the second microelectromechanical mechanism has an amplified displacement.

29. The microelectromechanical mechanism of claim 25, wherein the shuttle abuts a surface, the surface guiding a direction of travel of the shuttle.

30. The microelectromechanical mechanism of claim 25, wherein elongation of the expansion member is induced by an electrical current passing through the expansion member.

31. The microelectromechanical mechanism of claim 1, wherein the expansion member is configured to buckle during elongation.

32. The microelectromechanical mechanism of claim 1, further comprising a second expansion member connected to the base member and the shuttle.

33. The microelectromechanical mechanism of claim 32, wherein the second expansion member is disposed substantially parallel to the expansion member.

34. The microelectromechanical mechanism of claim 33, wherein first and second expansion members are grouped close together to prevent heat loss.

35. The microelectromechanical mechanism of claim 1, wherein elongation of the expansion member is induced by an ambient temperature increase.

36. The microelectromechanical mechanism of claim 1, wherein the expansion member has a width that varies along a length of the expansion member.

37. The microelectromechanical mechanism of claim 36, wherein the expansion member has an increased width of a central portion of the expansion member.

38. The microelectromechanical mechanism of claim 1, wherein the expansion member and the shuttle are integrally formed through a single manufacturing process.

39. The microelectromechanical mechanism of claim 1, wherein the expansion member has a material and shape selected to permit cyclical deflection of the expansion member with no substantial plastic deformation of the expansion member.

40. The microelectromechanical mechanism of claim 1, wherein the base member is at a fixed place.

41. The microelectromechanical mechanism of claim 40, wherein the base member is affixed on a silicon wafer.

42. The microelectromechanical mechanism of claim 40, wherein the base member is affixed to another microelectromechanical mechanism.

43. The microelectromechanical mechanism of claim 1, wherein the expansion member is configured to actuate the shuttle when thermal energy in the expansion member decreases.

44. A method for actuating a micromechanism, the micromechanism comprising an expansion member having a first end coupled to a base member and a second end coupled to a drivable shuttle, the method comprising:
   elongating the expansion member in an elongation direction;
   elastically buckling the expansion member against the shuttle;
   applying a biasing force resulting from buckling of the expansion member to the shuttle, a portion of the biasing force urging the shuttle in a direction substantially different from the elongation direction.

45. A method for actuating a micromechanism, the micromechanism comprising an expansion member having a first end coupled to a base member and a second end coupled to a drivable shuttle, the method comprising:
   providing an energy source; and
   disposing the energy source in communication with the expansion member to elongate the expansion member such that the expansion member buckles to bias the shuttle in an output direction substantially different from the elongation direction.

46. A method for actuating a micromechanism, the micromechanism comprising an expansion member, a base member, and a drivable shuttle, the method comprising:
   fixing a lateral distance between the base member and the shuttle;
   disposing the expansion member substantially perpendicular to the base member and the shuttle; and
   elongating the expansion member such that the expansion member presses against the shuttle, the expansion member moving from a substantially perpendicular disposition to displace the shuttle.

* * * * *

UNITED STATES PATENT AND TRADEMARK OFFICE
CERTIFICATE OF CORRECTION

PATENT NO. : 6,734,597 B1
DATED : May 11, 2004
INVENTOR(S) : Larry Howell et al.

It is certified that error appears in the above-identified patent and that said Letters Patent is hereby corrected as shown below:

Column 2,
Line 14, please delete ""A"" and replace with -- "U" --.

Column 3,
Line 10, please delete "econoznically" and replace with -- economically --.
Line 66, please delete "mnicroactuator" and replace with -- microactuator --.

Column 4,
Line 5, please delete "mnicroactuator" and replace with -- microactuator --.
Lines 43 and 52, please delete ""T
"" and replace with -- "I" --.

Column 6,
Line 37, please delete "Will" and replace with -- will --.

Column 7,
Line 17, please delete "25".

Column 8,
Line 55, please delete "way" and replace with -- may --.

Signed and Sealed this

Twenty-third Day of November, 2004

JON W. DUDAS
*Director of the United States Patent and Trademark Office*

UNITED STATES PATENT AND TRADEMARK OFFICE
CERTIFICATE OF CORRECTION

PATENT NO. : 6,734,597 B1  
APPLICATION NO. : 10/312172  
DATED : May 11, 2004  
INVENTOR(S) : Larry Howell et al.

Page 1 of 1

It is certified that error appears in the above-identified patent and that said Letters Patent is hereby corrected as shown below:

At col. 1, line 3, please insert:

-- This invention was made with government support under contract number SMI – 9624574 awarded by the National Science Foundation (NSF). The government has certain rights in the invention. --

Signed and Sealed this

Third Day of November, 2009

David J. Kappos  
*Director of the United States Patent and Trademark Office*